(12) United States Patent
Zhao

(10) Patent No.: US 11,282,924 B2
(45) Date of Patent: Mar. 22, 2022

(54) SEMICONDUCTOR DEVICE, RELATED MANUFACTURING METHOD, AND RELATED ELECTRONIC DEVICE

(71) Applicant: Semiconductor Manufacturing International (Shanghai) Corporation, Shanghai (CN)

(72) Inventor: Meng Zhao, Shanghai (CN)

(73) Assignee: Semiconductor Manufacturing International (Shanghai) Corporation

( * ) Notice: Subject to any disclaimer, the term of this patent is extended or adjusted under 35 U.S.C. 154(b) by 38 days.

(21) Appl. No.: 16/242,283

(22) Filed: Jan. 8, 2019

(65) Prior Publication Data
US 2019/0140055 A1 May 9, 2019

Related U.S. Application Data

(63) Continuation of application No. 14/583,493, filed on Dec. 26, 2014, now Pat. No. 10,211,289.

(30) Foreign Application Priority Data

Jan. 20, 2014 (CN) .......................... 201410025292.4

(51) Int. Cl.
*H01L 29/66* (2006.01)
*H01L 29/10* (2006.01)
(Continued)

(52) U.S. Cl.
CPC .... *H01L 29/1054* (2013.01); *H01L 21/02529* (2013.01); *H01L 21/02532* (2013.01);
(Continued)

(58) Field of Classification Search
CPC ............. H01L 29/1054; H01L 29/7849; H01L 29/7842; H01L 29/7843; H01L 29/165;
(Continued)

(56) References Cited

U.S. PATENT DOCUMENTS

2002/0037619 A1* 3/2002 Sugihara ........... H01L 29/66651
438/289
2003/0148584 A1 8/2003 Roberds et al.
(Continued)

OTHER PUBLICATIONS

"The General Properties of Si, Ge, SiGe, SiO2 and Si3N4" (Jun. 2002) Virginia Semiconductor Inc.—The World's Leading On-line Source for Silicon Wafters & Substrates Since 1997. N.p., N.d. Web. Jul. 28, 2016. http://www.virginiasemi.com/pdf/generalpropertiesSi62002.pdf.

*Primary Examiner* — Lauren R Bell
(74) *Attorney, Agent, or Firm* — Innovation Counsel LLP

(57) ABSTRACT

A semiconductor device may include a semiconductor substrate. The semiconductor device may further include a gate electrode that overlaps the semiconductor substrate. The semiconductor device may further include a channel region that overlaps at least one of the gate electrode and the semiconductor substrate. The semiconductor device may further include a stress adjustment element that contacts the channel region and is positioned between the channel region and a surface of the semiconductor substrate in a direction perpendicular to the surface of the semiconductor substrate. A maximum width of the channel region in a direction parallel to the surface of the semiconductor substrate is greater than a maximum width of the stress adjustment element in the direction parallel to the surface of the semiconductor substrate in a cross-sectional view of the semiconductor device.

13 Claims, 8 Drawing Sheets

(51) Int. Cl.
  *H01L 21/306* (2006.01)
  *H01L 21/02* (2006.01)
  *H01L 29/06* (2006.01)
  *H01L 29/08* (2006.01)
  *H01L 29/16* (2006.01)
  *H01L 29/78* (2006.01)
  *H01L 29/165* (2006.01)

(52) U.S. Cl.
  CPC .... *H01L 21/30608* (2013.01); *H01L 29/0657* (2013.01); *H01L 29/0688* (2013.01); *H01L 29/0847* (2013.01); *H01L 29/165* (2013.01); *H01L 29/1608* (2013.01); *H01L 29/66545* (2013.01); *H01L 29/7842* (2013.01); *H01L 21/02433* (2013.01); *H01L 29/66636* (2013.01); *H01L 29/7833* (2013.01); *H01L 29/7848* (2013.01)

(58) Field of Classification Search
  CPC ........... H01L 29/66545; H01L 29/7848; H01L 29/6659; H01L 29/66636
  See application file for complete search history.

(56) References Cited

U.S. PATENT DOCUMENTS

| | | |
|---|---|---|
| 2008/0179627 A1 | 7/2008 | Ieong et al. |
| 2009/0085125 A1 | 4/2009 | Kim et al. |
| 2010/0187578 A1 | 7/2010 | Faltermeier |
| 2013/0270628 A1* | 10/2013 | Huang ................ H01L 29/1037 257/329 |
| 2014/0015003 A1* | 1/2014 | Koo .................... H01L 29/7813 257/139 |
| 2014/0138763 A1* | 5/2014 | Yang ................. H01L 29/66651 257/329 |
| 2014/0319625 A1* | 10/2014 | Zhao ................... H01L 29/0653 257/402 |
| 2015/0035055 A1* | 2/2015 | Wang ................ H01L 29/66689 257/339 |

* cited by examiner

S101 Preparing a semiconductor substrate; forming a dummy gate element that overlaps the semiconductor substrate.

S102 Forming a dielectric layer such that the dummy gate element is positioned between two portions of the dielectric layer; removing the dummy gate element.

S103 Forming a trench in the semiconductor substrate, wherein an upper portion of the trench is wider than a lower portion of the trench in a cross section of the trench.

S104 Forming a stress adjustment element in the trench; subsequently forming a channel region in the trench.

FIG. 3

SEMICONDUCTOR DEVICE, RELATED MANUFACTURING METHOD, AND RELATED ELECTRONIC DEVICE

CROSS-REFERENCE TO RELATED APPLICATION

This is a continuation application of U.S. application Ser. No. 14/583,493 filed on 20 Jan. 2015, which application claims priority to and benefit of Chinese Patent Application No. 201410025292.4, filed on 20 Jan. 2014, each of which are incorporated herein by reference in their entireties.

BACKGROUND OF THE INVENTION

The present invention is related to a semiconductor device, a method for manufacturing the semiconductor device, and an electronic device that includes the semiconductor device.

For minimizing the size and/or maximizing the functionality of an electronic device, sizes of semiconductor devices included in the electronic device may need to be minimized. Nevertheless, in reducing the size of a semiconductor device, e.g., a metal-oxide-semiconductor field-effect transistor (MOSFET), mitigation of undesirable short-channel effects may be substantially difficult because of factors such as those related to the gate oxide thickness and the supply voltage.

One or more ultra-shallow junctions may be implemented for alleviating short-channel effects in a MOSFET. Nevertheless, implementation of ultra-shallow junctions may increase difficulty in minimizing undesirable drain junction capacitance and junction leakage, especially for an N-type metal-oxide-semiconductor (NMOS) device with two-step source/drain implantation.

For mitigating the aforementioned issues, in a semiconductor device, embedded silicon-germanium (SiGe) or silicon carbide (SiC) layers may be implemented in a semiconductor substrate at two sides of a gate electrode. Nevertheless, the process of forming the SiGe or SiC layers may cause undesirable damage to elements or structures of the semiconductor device. As a result, performance of the semiconductor device related to drain-induced barrier lowering and off-state current may be undesirable.

SUMMARY

An embodiment of the present invention may be related to a semiconductor device that may include a semiconductor substrate. The semiconductor device may further include a gate electrode that overlaps the semiconductor substrate. The semiconductor device may further include a channel region that overlaps at least one of the gate electrode and the semiconductor substrate. The semiconductor device may further include a stress adjustment element that contacts the channel region and is positioned between the channel region and a surface of the semiconductor substrate in a direction perpendicular to the surface of the semiconductor substrate. A maximum width of the channel region in a direction parallel to the surface of the semiconductor substrate is greater than a maximum width of the stress adjustment element in the direction parallel to the surface of the semiconductor substrate in a cross-sectional view of the semiconductor device.

The semiconductor substrate may be a silicon substrate that has a 100, 110, or 111 crystal orientation.

A dopant concentration of a dopant material in the stress adjustment element may have a first dopant concentration value. The channel region may be an intrinsic semiconductor element, or a dopant concentration of the dopant material in the channel region may have a second dopant concentration value that is less than the first dopant concentration value. The second dopant concentration value may be greater than or equal to 1e15/cm^3.

The semiconductor device may be a P-type metal-oxide-semiconductor transistor, wherein the dopant material may be germanium, the stress adjustment element may be a first silicon-germanium element, and the channel region may be an intrinsic semiconductor element or a second silicon-germanium layer.

The semiconductor device may be an N-type metal-oxide-semiconductor transistor, wherein the dopant material may be carbon, the stress adjustment element may be a first silicon carbide element, and the channel region may be an intrinsic semiconductor element or a second silicon carbide layer.

A cross section of a combination of the stress adjustment element and the channel region may have a triangle shape in the cross-sectional view of the semiconductor device. A vertex of the triangle may be positioned between an edge of the triangle shape and the surface of the semiconductor substrate.

A sum of a height of a middle portion of the stress adjustment element and a height of a middle portion of the channel region in the direction perpendicular to the surface of the semiconductor substrate may be in a range of 30 nm to 100 nm.

The semiconductor device may include a source electrode and a drain electrode. A portion of the channel region may be positioned between two portions of the stress adjustment element. The two portions of the stress adjustment element are positioned between the channel region and, respectively, the source electrode and the drain electrode.

The semiconductor device may include a source electrode and a drain electrode. A first portion of the semiconductor substrate may be positioned between the stress adjustment element and the source electrode in a direction parallel to the surface of the semiconductor substrate. A second portion of the semiconductor substrate may be positioned between the stress adjustment element and the drain electrode in the direction parallel to the surface of the semiconductor substrate.

The semiconductor device may include lightly doped drain ion-implanted regions and/or pocket ion-implanted regions positioned in the semiconductor substrate. The lightly doped drain ion-implanted regions and/or the pocket ion-implanted regions may be positioned at two opposite sides of the channel region.

An embodiment of the invention may be related to a method for manufacturing a semiconductor device. The method may include the following steps: preparing a semiconductor substrate; forming a trench in the semiconductor substrate; forming a stress adjustment element inside the trench; forming a channel region on the stress adjustment element and inside the trench; and forming a gate electrode that overlaps at least one of the semiconductor substrate and the channel region in a direction perpendicular to a surface of the semiconductor substrate. A maximum width of the channel region in a direction parallel to the surface of the semiconductor substrate is greater than a maximum width of the stress adjustment element in the direction parallel to the surface of the semiconductor substrate in a cross-sectional view of the semiconductor device.

The semiconductor substrate may be a silicon substrate that has a 100, 110, or 111 crystal orientation. The trench may be formed through wet etching without dry etching. An etchant that includes one or more of hydrofluoric acid, potassium hydroxide, hydrogen bromide, and acetic acid may be used in the wet etching.

A dopant concentration of a dopant material in the stress adjustment element may have a first dopant concentration value. The channel region may be an intrinsic semiconductor element, or a dopant concentration of the dopant material in the channel region may have a second dopant concentration value that is less than the first dopant concentration value. The second dopant concentration value may be greater than or equal to $1e15/cm^3$.

The semiconductor device may be a P-type metal-oxide-semiconductor transistor, wherein the dopant material may be germanium, the stress adjustment element may be a first silicon-germanium element, and the channel region may be an intrinsic semiconductor element or a second silicon-germanium layer.

The semiconductor device may be an N-type metal-oxide-semiconductor transistor, wherein the dopant material may be carbon, the stress adjustment element may be a first silicon carbide element, and the channel region may be an intrinsic semiconductor element or a second silicon carbide layer.

A cross section of the trench may have a triangle shape in a cross-sectional view of the semiconductor device. A vertex of the triangle may be positioned between an edge of the triangle shape and the surface of the semiconductor substrate.

A depth of a middle portion of the trench in the direction perpendicular to the surface of the semiconductor substrate is in a range of 30 nm to 100 nm.

The method may include forming a source electrode and a drain electrode. A portion of the channel region may be positioned between two portions of the stress adjustment element. The two portions of the stress adjustment element may be positioned between the channel region and, respectively, the source electrode and the drain electrode.

The method may include forming a source electrode and a drain electrode. A first portion of the semiconductor substrate may be positioned between the stress adjustment element and the source electrode in the direction parallel to the surface of the semiconductor substrate. A second portion of the semiconductor substrate may be positioned between the stress adjustment element and the drain electrode in the direction parallel to the surface of the semiconductor substrate.

The method may include forming a lightly-doped drain ion-implanted region and/or forming a pocket ion-implanted region before or after forming at least one of the stress adjustment element and the channel region.

The method may include forming a dummy gate element, forming a dielectric layer with two portions positioned at two opposite sides of the dummy gate element, and removing the dummy gate element after the formation of the dielectric layer. The gate electrode may be formed between the two portions of the dielectric layer at the position where the dummy gate element has been formed.

An embodiment of the invention may be related to an electronic device that includes a semiconductor device. The semiconductor device may include the following elements: a semiconductor substrate; a gate electrode overlapping the semiconductor substrate; a channel region overlapping at least one of the gate electrode and the semiconductor substrate; and a stress adjustment element contacting the channel region and being positioned between the channel region and a surface of the semiconductor substrate in a direction perpendicular to the surface of the semiconductor substrate. A maximum width of the channel region may be greater than a maximum width of the stress adjustment element in a cross-sectional view of the semiconductor device.

According to embodiments of the invention, the wide-narrow structure of the channel region and the stress adjustment element may facilitate mitigation of undesirable short-channel effects in the semiconductor device and/or may facilitate protection of the semiconductor device against damage potentially caused by electrostatic discharge effects. The dopant concentration relation and/or width configuration relations of the stress adjustment element and the channel region may enable minimization of impurity scattering and/or impurity diffusion in the channel region. Advantageously, satisfactory quality and performance of semiconductor devices (and related electronic devices) may be provided.

The above summary is related to one or more of many embodiments of the invention disclosed herein and is not intended to limit the scope of the invention.

BRIEF DESCRIPTION OF THE DRAWINGS

FIG. 3 shows a flowchart that illustrates a method for manufacturing a semiconductor device in accordance with an embodiment of the present invention.

DETAILED DESCRIPTION

Figure 1:
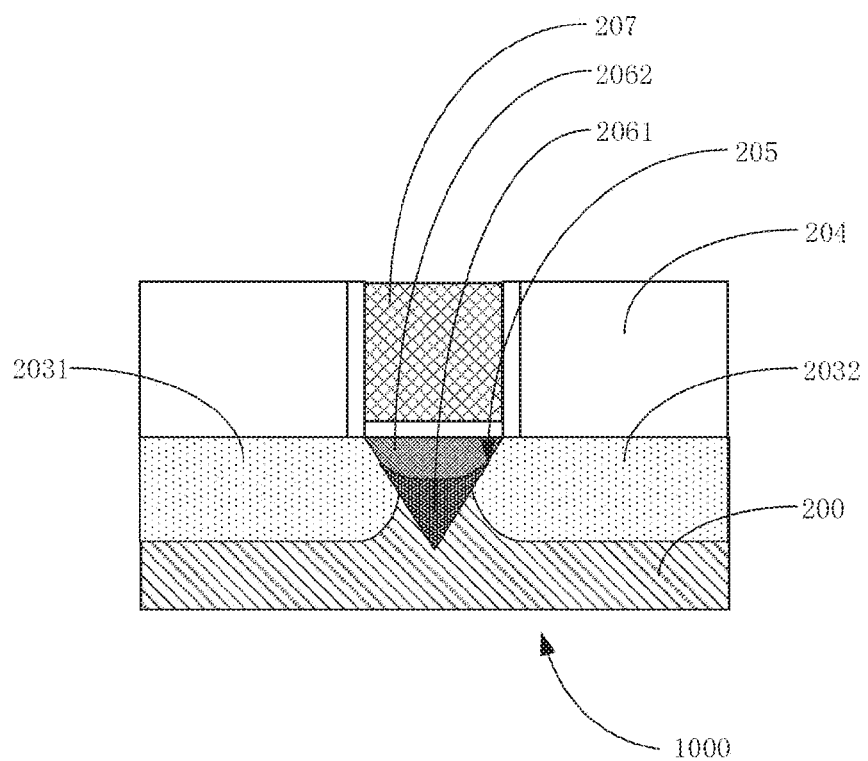
FIG. 1 shows a schematic cross-sectional view that illustrates elements and structures of a semiconductor device in accordance with an embodiment of the present invention.

Example embodiments of the present invention are described with reference to the accompanying drawings. As those skilled in the art would realize, the described embodiments may be modified in various different ways, all without departing from the spirit or scope of the present invention. Embodiments of the present invention may be practiced without some or all of these specific details. Well known process steps and/or structures may not have been described in detail in order to not unnecessarily obscure the present invention.

The drawings and description are illustrative and not restrictive. Like reference numerals may designate like (e.g., analogous or identical) elements in the specification. Repetition of description may be avoided.

The relative sizes and thicknesses of elements shown in the drawings are for facilitate description and understanding, without limiting the present invention. In the drawings, the thicknesses of some layers, films, panels, regions, etc., may be exaggerated for clarity.

Illustrations of example embodiments in the figures may represent idealized illustrations. Variations from the shapes illustrated in the illustrations, as a result of, for example, manufacturing techniques and/or tolerances, may be possible. Thus, the example embodiments should not be construed as limited to the shapes or regions illustrated herein but are to include deviations in the shapes. For example, an etched region illustrated as a rectangle may have rounded or curved features. The shapes and regions illustrated in the figures are illustrative and should not limit the scope of the example embodiments.

Although the terms "first", "second", etc. may be used herein to describe various elements, these elements, should not be limited by these terms. These terms may be used to distinguish one element from another element. Thus, a first element discussed below may be termed a second element without departing from the teachings of the present invention. The description of an element as a "first" element may not require or imply the presence of a second element or other elements. The terms "first", "second", etc. may also be used herein to differentiate different categories or sets of elements. For conciseness, the terms "first", "second", etc. may represent "first-category (or first-set)", "second-category (or second-set)", etc., respectively.

If a first element (such as a layer, film, region, or substrate) is referred to as being "on", "neighboring", "connected to", or "coupled with" a second element, then the first element can be directly on, directly neighboring, directly connected to, or directly coupled with the second element, or an intervening element may also be present between the first element and the second element. If a first element is referred to as being "directly on", "directly neighboring", "directly connected to", or "directed coupled with" a second element, then no intended intervening element (except environmental elements such as air) may also be present between the first element and the second element.

Spatially relative terms, such as "beneath", "below", "lower", "above", "upper", and the like, may be used herein for ease of description to describe one element or feature's spatial relationship to another element(s) or feature(s) as illustrated in the figures. It will be understood that the spatially relative terms may encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations), and the spatially relative descriptors used herein should be interpreted accordingly.

The terminology used herein is for the purpose of describing particular embodiments and is not intended to limit the invention. As used herein, the singular forms, "a", "an", and "the" may indicate plural forms as well, unless the context clearly indicates otherwise. The terms "includes" and/or "including", when used in this specification, may specify the presence of stated features, integers, steps, operations, elements, and/or components, but may not preclude the presence or addition of one or more other features, integers, steps, operations, elements, components, and/or groups.

Unless otherwise defined, terms (including technical and scientific terms) used herein have the same meanings as commonly understood by one of ordinary skill in the art related to this invention. Terms, such as those defined in commonly used dictionaries, should be interpreted as having meanings that are consistent with their meanings in the context of the relevant art and should not be interpreted in an idealized or overly formal sense unless expressly so defined herein.

The term "connect" may mean "electrically connect". The term "insulate" may mean "electrically insulate".

Unless explicitly described to the contrary, the word "comprise" and variations such as "comprises", "comprising", "include", or "including" may imply the inclusion of stated elements but not the exclusion of other elements.

Various embodiments, including methods and techniques, are described in this disclosure. Embodiments of the invention may also cover an article of manufacture that includes a non-transitory computer readable medium on which computer-readable instructions for carrying out embodiments of the inventive technique are stored. The computer readable medium may include, for example, semiconductor, magnetic, opto-magnetic, optical, or other forms of computer readable medium for storing computer readable code. Further, the invention may also cover apparatuses for practicing embodiments of the invention. Such apparatus may include circuits, dedicated and/or programmable, to carry out operations pertaining to embodiments of the invention. Examples of such apparatus include a general purpose computer and/or a dedicated computing device when appropriately programmed and may include a combination of a computer/computing device and dedicated/programmable hardware circuits (such as electrical, mechanical, and/or optical circuits) adapted for the various operations pertaining to embodiments of the invention.

FIG. 1 shows a schematic cross-sectional view that illustrates elements and structures of a semiconductor device 1000 in accordance with an embodiment of the present invention. As illustrated in FIG. 1, the semiconductor device 1000 may include the following elements: a semiconductor substrate 200; an dielectric layer 204 (e.g., an interlayer dielectric layer) that overlaps the semiconductor substrate 200; a gate electrode 207 that overlaps the semiconductor substrate 200 and is substantially positioned between two portions of the dielectric layer 204; a source electrode 2031 and a drain electrode 2032 that are substantially positioned at two opposite sides of the gate electrode 207, are substantially positioned in the semiconductor substrate 200, and overlap the two portions of the dielectric layer 204; a trench 205 that is substantially positioned between the source electrode 2031 and the drain electrode 2032 and is substantially positioned between the gate electrode 207 and a portion of the semiconductor substrate 200 (e.g., the bottom portion of the semiconductor substrate 200 shown in FIG. 1) in a direction perpendicular to a surface of the semiconductor substrate 200 (e.g., the bottom surface of the semiconductor substrate 200 shown in FIG. 1); and a stress adjustment element 2061 (e.g., a stress adjustment layer) and a channel region 2062 that are substantially positioned inside the trench 205.

The semiconductor device 1000 may include one or more other elements. For example, the semiconductor device 1000 may include one or more of a metal silicide, a contact hole etch stop layer, gate sidewalls, etc.

The semiconductor device 1000 may include lightly doped drain (LDD) ion-implanted regions and/or pocket (PKT) ion-implanted regions (no shown in FIG. 1) positioned in the semiconductor substrate 200. The LDD ion-implanted regions and/or the PKT ion-implanted regions may be positioned at two opposite sides of the channel region 2062 for minimizing undesirable short-channel effects.

In an embodiment, the semiconductor substrate 200 may be a silicon substrate that has a 100, 110, or 111 crystal orientation.

In an embodiment, the source electrode 2031 and the drain electrode 2032 may be formed through ion implantation.

In an embodiment, the source electrode 2031 and the drain electrode 2032 may be formed through epitaxial growth of SiGe members (if the semiconductor device 1000 is a PMOS device) or SiC members (if the semiconductor device 1000 is a NMOS device) in previously formed trenches. A boron (B) material, such as B or boron difluoride ($BF_2$), may be doped in the SiGe or SiC members for forming the source electrode 2031 and the drain electrode 2032. For desirable protection against electrostatic discharge (ESD), the B dopant concentration may be configured in a range of 5e18 to 1e20. Advantageously, the semiconductor device 1000 may be used in applications that require substantial protection against ESD.

The trench 205 may have a substantially prism geometric structure (or shape). A first portion of the trench 205 (e.g., the bottom portion of the trench 205 shown in FIG. 1) may be positioned closer to a surface of the semiconductor substrate 200 (e.g., the bottom surface of the semiconductor substrate 200 shown in FIG. 1) than a second portion of the trench 205 (e.g., the top portion of the trench 205 shown in FIG. 1). The first portion of the trench 205 may be substantially positioned between the second portion of the trench 205 and the (bottom) surface of the semiconductor substrate 200. The second portion of the trench 205 may be substantially positioned between the first portion of the trench 205 and the gate electrode 207. In a cross-sectional view of the semiconductor device 1000 that shows all of the gate electrode 207, the source electrode 2031, and the drain electrode 2032 (e.g., the cross-sectional view shown in FIG. 1), (the maximum width of) the second portion of the trench 205 may be wider than (the maximum width of) the first portion of the trench 205.

In an embodiment, the trench 205 may have a substantially V-shaped and/or (inverted) triangle cross section, such as a substantially (inverted) isosceles triangle cross section, in a cross-sectional view of the semiconductor device 1000 that shows all of the gate electrode 207, the source electrode 2031, and the drain electrode 2032. The first portion of the trench 205 may have a substantially (inverted) triangle cross section in the cross-sectional view of the semiconductor device 1000.

In an embodiment, the trench 205 may have a substantially (inverted) trapezoid cross section, such as a substantially (inverted) isosceles trapezoid cross section, in a cross-sectional view of the semiconductor device 1000 that shows all of the gate electrode 207, the source electrode 2031, and the drain electrode 2032. The first portion of the trench 205 may have a substantially (inverted) trapezoid cross section in the cross-sectional view of the semiconductor device 1000.

For optimizing the performance of the semiconductor device, a maximum depth of the trench 205 (e.g., the depth of a middle portion of the trench 205) in a direction perpendicular to the bottom surface of the semiconductor substrate 200 may be configured in a range of 30 nm to 100 nm; i.e., the sum of the height of a middle portion of the stress adjustment element 2061 and the height of a middle portion of the channel region 2062 in the direction perpendicular to the bottom surface of the semiconductor substrate 200 may be in a range of 30 nm to 100 nm. The depth (or height) of the trench 205 may be the distance between the widest side of the trench 205 and the opposite side/point of the trench 205 (opposite the widest side of the trench 205) in a cross-sectional view of the semiconductor device 1000 that shows all of the gate electrode 207, the source electrode 2031, and the drain electrode 2032.

As shown in FIG. 1, the stress adjustment element 2061 may be substantially positioned between the channel region 2062 and the (bottom) surface of the semiconductor substrate 200 (and may be substantially positioned inside the first portion of the trench 205). A first portion of the semiconductor substrate 200 may be positioned between the stress adjustment element 2061 and the source electrode 2031 in a direction parallel to the (bottom) surface of the semiconductor substrate 200. A second portion of the semiconductor substrate 200 may be positioned between the stress adjustment element 2061 and the drain electrode 2032 in a direction parallel to the (bottom) surface of the semiconductor substrate 200. The stress adjustment element 2061 is positioned between the first portion of the semiconductor substrate 200 and the second portion of the semiconductor substrate 200 in a direction parallel to the (bottom) surface of the semiconductor substrate 200. The channel region 2062 may be substantially positioned between the stress adjustment element 2061 and the gate electrode 207 (and may be substantially positioned inside the second portion of the trench 205).

A first portion of the stress adjustment element 2061 (e.g., the bottom portion of the stress adjustment element 2061 shown in FIG. 1) may be positioned closer to a surface of the semiconductor substrate 200 (e.g., the bottom surface of the semiconductor substrate 200 shown in FIG. 1) than a second portion of the stress adjustment element 2061 (e.g., the top portion of the stress adjustment element 2061 shown in FIG. 1). The first portion of the stress adjustment element 2061 may be substantially positioned between the second portion of the stress adjustment element 2061 and the (bottom) surface of the semiconductor substrate 200. The second portion of the stress adjustment element 2061 may be substantially positioned between the first portion of the stress adjustment element 2061 and the gate electrode 207 and may be substantially positioned between the first portion of the stress adjustment element 2061 and the channel region 2062. In a cross-sectional view of the semiconductor device 1000, (the maximum width of) the second portion of the stress adjustment element 2061 in a direction parallel to the bottom surface of the semiconductor substrate 200 may be wider than (the maximum width of) the first portion of the stress adjustment element 2061 in the direction parallel to the bottom surface of the semiconductor substrate 200.

In an embodiment, the first portion of the stress adjustment element 2061 may have a substantially (inverted) triangle cross section, such as a substantially (inverted) isosceles triangle cross section, in a cross-sectional view of the semiconductor device 1000 that shows all of the gate electrode 207, the source electrode 2031, and the drain electrode 2032.

In an embodiment, the first portion of the stress adjustment element 2061 may have a substantially (inverted) trapezoid cross section, such as a substantially (inverted) isosceles trapezoid cross section, in a cross-sectional view of the semiconductor device 1000 that shows all of the gate electrode 207, the source electrode 2031, and the drain electrode 2032.

A first portion of the channel region 2062 (e.g., the bottom portion of the channel region 2062 shown in FIG. 1) may be positioned closer to a surface of the semiconductor substrate 200 (e.g., the bottom surface of the semiconductor substrate 200 shown in FIG. 1) than a second portion of the channel region 2062 (e.g., the top portion of the channel region 2062 shown in FIG. 1). The first portion of the channel region 2062 may be substantially positioned between the second portion of the channel region 2062 and the (bottom) surface of the semiconductor substrate 200 and may be substantially positioned between the second portion of the channel region 2062 and the stress adjustment element 2061. The second portion of the channel region 2062 may be substantially positioned between the first portion of the channel region 2062 and the gate electrode 207. In a cross-sectional view of the semiconductor device 1000, (the maximum width of) the second portion of the channel region 2062 may be wider than (the maximum width of) the first portion of the channel region 2062.

The first portion of the channel region 2062 may be substantially attached to (the second portion of) the stress adjustment element 2061, may be positioned between two portions of (the second portion of) the stress adjustment element 2061, and/or surrounded by (the second portion of) the stress adjustment element 2061. The two portions of (the second portion of) the stress adjustment element 2061 may be positioned between the channel region 2062 and, respectively, the source electrode 2031 and the drain electrode 2032.

The stress adjustment element 2061 may adjust stress in the channel region 2062, such that the performance of the semiconductor device 1000 may be enhanced. Since the first portion of the channel region 2062 (narrower than the second portion of the channel region 2062) may be substantially attached to the second portion of the stress adjustment element 2061 (wider than the first portion of the stress adjustment element 2061), the surface tension of the channel region 2062 may be optimized (e.g., maximized), such that protection of the semiconductor device against voltage caused by electrostatic discharge (ESD) may be optimized. Advantageously, performance of the semiconductor device 1000 may be optimized.

The aforementioned wide-narrow structure of the trench 205 may minimize or substantially prevent damage to the LDD ion-implanted regions and/or the PKT ion-implanted regions. Therefore, short-channel effects may be further effectively mitigated. Advantageously, satisfactory quality and/or performance of the semiconductor device 1000 may be substantially ensured and/or attained.

The stress adjustment element 2061 may be an extrinsic semiconductor element and may be doped with a first set of a first dopant material such that the first set of the first dopant material has a first concentration value in the stress adjustment element 2061. The channel region 2062 may be an intrinsic semiconductor element or may be doped with a second set of the first dopant material such that the second set of the first dopant material has a second concentration value in the channel region 2062. The first concentration value may be greater than the second concentration value. The second concentration value may be greater than or equal to 1e15/cm^3. The first concentration value and the second concentration value may be based on number concentration or atomic percent.

In an embodiment, the semiconductor device 1000 may be a P-type metal-oxide-semiconductor (PMOS) transistor, wherein the first dopant material may be germanium (Ge), the stress adjustment element 2061 may be a first silicon-germanium (SiGe) layer having a first Ge dopant concentration value, the channel region 2062 may be a second SiGe layer having a second Ge dopant concentration value lower than the first Ge dopant concentration value or may be an intrinsic semiconductor layer.

In an embodiment, the semiconductor device 1000 may be an N-type metal-oxide-semiconductor (NMOS) transistor, wherein the first dopant material may be carbon (C), the stress adjustment element 2061 may be a first silicon carbide (SiC) layer having a first C dopant concentration value, the channel region 2062 may be a second SiC layer having a second C dopant concentration value lower than the first C dopant concentration value or may be an intrinsic semiconductor layer.

The aforementioned dopant concentration relation and/or width configuration relations of the stress adjustment element 2061 and the channel region 2062 inside the trench 205 may enable minimization of impurity scattering and/or impurity diffusion in the channel region 2062. Advantageously, channel mobility and other operation characteristics of the semiconductor device 1000 may be optimized.

FIG. 2A, FIG. 2B, FIG. 2C, FIG. 2D, FIG. 2E, FIG. 2F, FIG. 2G, FIG. 2H, and FIG. 2I show schematic cross-sectional views that illustrate structures formed in a method for manufacturing the semiconductor device 1000 in accordance with an embodiment of the present invention. FIG. 3 shows a flowchart that illustrates a method for manufacturing a semiconductor device, for example, the semiconductor device 1000 related to FIGS. 2A to 2I, in accordance with an embodiment of the present invention.

Referring to FIG. 3, the method may include a step S101, a step S102, a step S103, and a step 104.

Figure 2A:
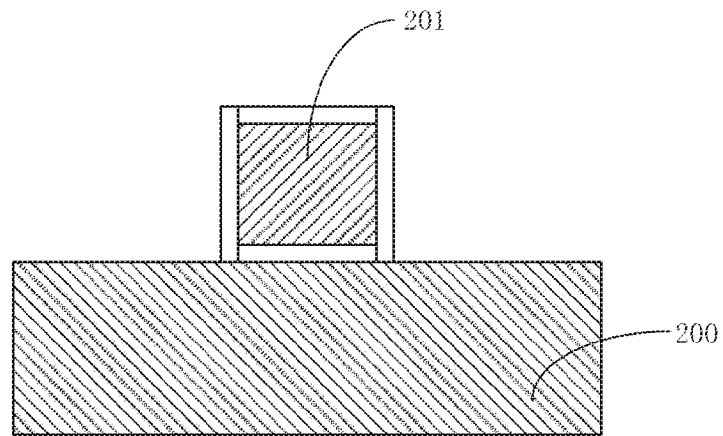
FIG. 2A, FIG. 2B, FIG. 2C, FIG. 2D, FIG. 2E, FIG. 2F, FIG. 2G, FIG. 2H, and FIG. 2I show schematic cross-sectional views that illustrate structures formed in a method for manufacturing a semiconductor device in accordance with an embodiment of the present invention.

Referring to FIG. 3 and FIG. 2A, the step S101 may include preparing a semiconductor substrate (e.g., the semiconductor substrate 200 illustrated in FIG. 2A) and forming a dummy gate element (e.g., the dummy gate element 201 illustrated in FIG. 2A) that overlaps the semiconductor substrate 200. The semiconductor substrate 200 may be a silicon substrate that has a 100, 110, or 111 crystal orientation. The semiconductor substrate 200 may have an alternative or additional material and/or crystal orientation. The dummy gate element 201 may be formed of a polysilicon material. One or more spacers and/or one or more oxide layers may be formed on the dummy gate element 201.

Figure 2B:
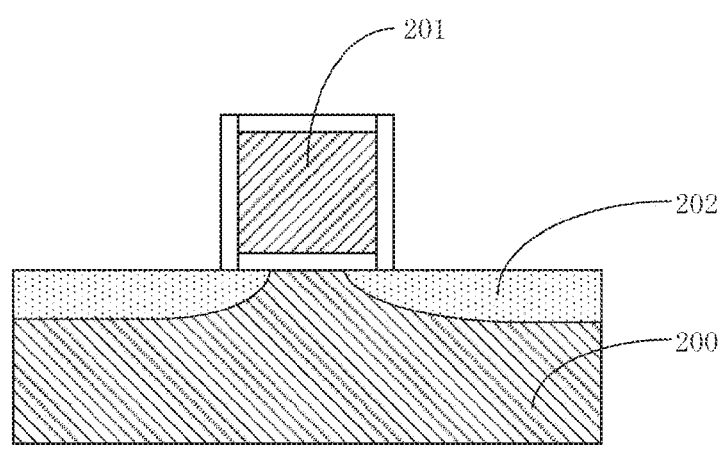

Referring to FIG. 2B, the method may include implanting ions to form a lighted-doped drain (LDD) ion-implanted region 202 in the semiconductor substrate 200. Additionally or alternatively, a pocket (PKT) ion-implanted region may be formed in the semiconductor substrate 200.

Figure 2C:
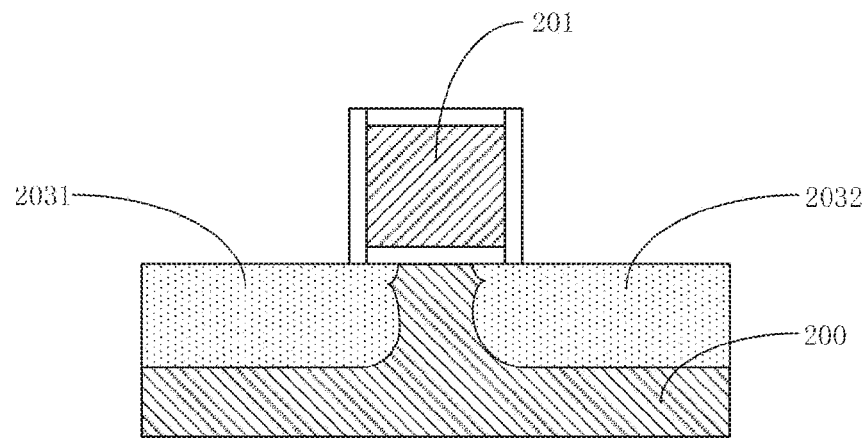

Referring to FIG. 2C, a source electrode 2031 and a drain electrode 2032 may be formed in the semiconductor substrate 200. In an embodiment, the source electrode 2031 and the drain electrode 2032 may be formed through ion implantation. In an embodiment, trenches may be formed, and the source electrode 2031 and the drain electrode 2032 may be formed through epitaxial growth of SiGe members (in manufacturing a PMOS semiconductor device) or SiC members (in manufacturing an NMOS semiconductor device) in the trenches. Annealing may be performed in the epitaxial growth process. A boron (B) material, such as B or boron difluoride ($BF_2$), may be doped in the SiGe or SiC members for forming the source electrode 2031 and the drain electrode 2032. For desirable protection against electrostatic discharge (ESD), the B dopant concentration may be configured in a range of 5e18 to 1e20. Advantageously, the manufactured semiconductor device may be used in applications that require substantial protection against ESD.

Figure 2D:
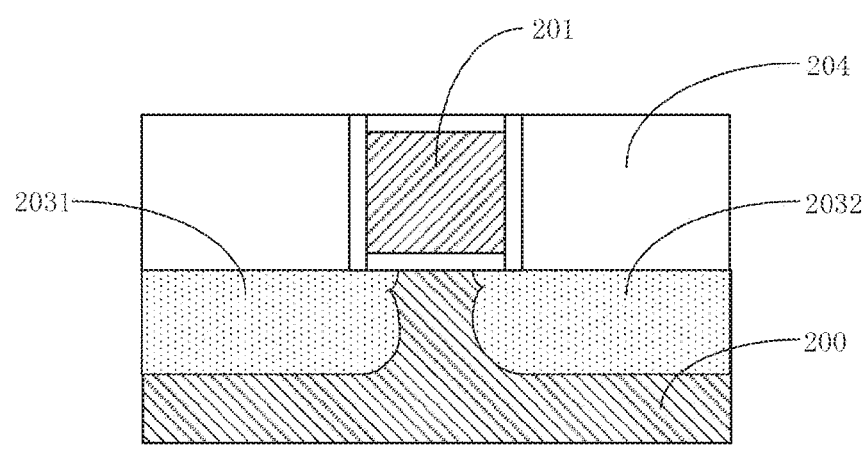
Figure 2E:
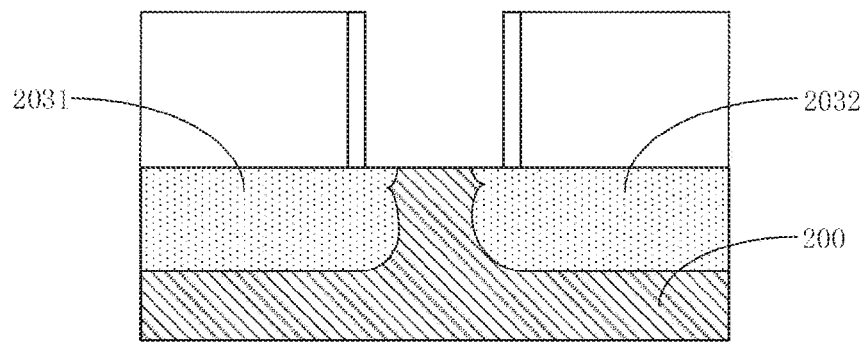

Referring to FIG. 3, FIG. 2D, and FIG. 2E, the step S102 may include forming a dielectric layer (e.g., the interlayer dielectric layer 204 illustrated in FIG. 2D) such that the dummy gate element (e.g., dummy gate element 201 illustrated in FIG. 2D) is positioned between two portions of the dielectric layer and subsequently removing the dummy gate element. A metal silicide and/or a contact hole etch stop layer may be formed prior to the formation of the dielectric layers. The dummy gate element 201 may be removed through etching and/or one or more other suitable processes.

Figure 2F:
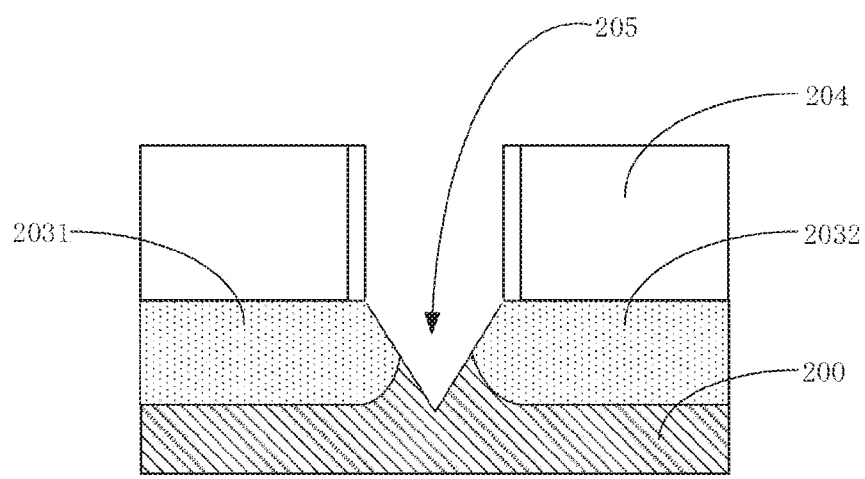

Referring to FIG. 3 and FIG. 2F, the step S103 may include forming a trench (e.g., the trench 205 illustrated in FIG. 2F) in the semiconductor substrate (e.g., the semiconductor substrate 200 illustrated in FIG. 2F). An upper portion of the trench 205, which is relatively farther from the bottom surface of the semiconductor substrate 200, may be wider than a lower portion of the trench 205, which is relatively closer to the bottom surface of the semiconductor substrate, in a cross section of the trench 205.

The trench 205 may have a V-shaped cross section may be formed in the semiconductor substrate 200 through wet etching without dry etching (which is typically performed in forming a conventional trench that has a U-shaped cross section). In the wet etching process, an etchant that includes one or more of hydrofluoric acid (HF), potassium hydroxide (KOH), hydrogen bromide (HBr), and acetic acid ($CH_3COOH$) may be used.

The trench 205 may have a substantially prism geometric structure (or shape). A first portion of the trench 205 (e.g., the bottom portion of the trench 205 shown in FIG. 2F) may be positioned closer to a surface of the semiconductor substrate 200 (e.g., the bottom surface of the semiconductor substrate 200 shown in FIG. 2F) than a second portion of the trench 205 (e.g., the top portion of the trench 205 shown in FIG. 2F). In a cross section of the trench 205 (e.g., the cross section of the trench shown in FIG. 2F), (the maximum width of) the second portion of the trench 205 may be wider than (the maximum width of) the first portion of the trench 205.

In an embodiment, the trench 205 may have a substantially V-shaped and/or (inverted) triangle cross section, such as a substantially (inverted) isosceles triangle cross section. The first portion of the trench 205 may have a substantially (inverted) triangle cross section.

In an embodiment, the trench 205 may have a substantially (inverted) trapezoid cross section, such as a substantially (inverted) isosceles trapezoid cross section. The first portion of the trench 205 may have a substantially (inverted) trapezoid cross section.

For optimizing the performance of the manufactured semiconductor device, the maximum depth of the trench 205 (e.g., the depth of a middle portion of the trench 205) in a direction perpendicular to the bottom surface of the semiconductor substrate 200 may be configured in a range of 30 nm to 100 nm.

Figure 2G:
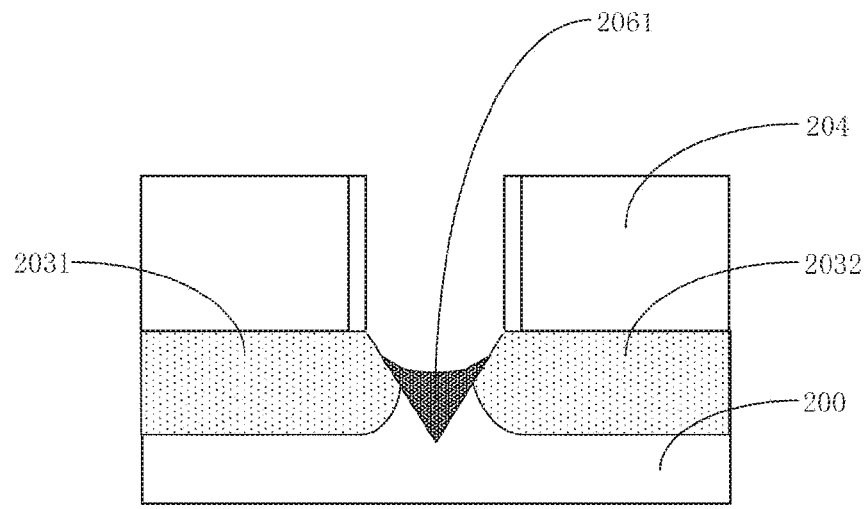
Figure 2H:
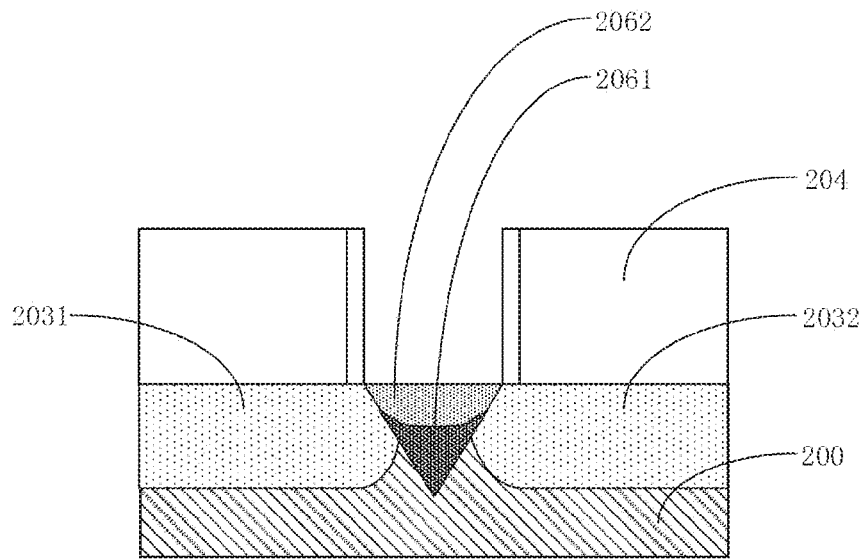

Referring to FIG. 3, FIG. 2G, and FIG. 2H, the step S104 may include forming a stress adjustment element (e.g., the stress adjustment element 2061 illustrated in FIG. 2G) in the trench (e.g., the trench 205 illustrated in FIG. 2F, FIG. 2G, and FIG. 2H) and subsequently forming a channel region (e.g., the channel region 2062 illustrated in FIG. 2H) in the trench (e.g., the trench 205). The stress adjustment element 2061 and the channel region 2062 may be formed through epitaxial growth and/or one or more other suitable processes.

The stress adjustment element 2061 may be doped with a first set of a first dopant material such that the first set of the first dopant material has a first concentration value in the stress adjustment element 2061. The channel region 2062 may be an intrinsic semiconductor element or may be doped with a second set of the first dopant material such that the second set of the first dopant material has a second concentration value in the channel region 2062. The first concentration value may be greater than the second concentration value. The second concentration value may be greater than or equal to $1e15/cm^3$. The first concentration value and the second concentration value may be based on number concentration or atomic percent.

In an embodiment, the manufactured semiconductor device may be a P-type metal-oxide-semiconductor (PMOS) transistor, wherein the first dopant material may be germanium (Ge), the stress adjustment element 2061 may be a first silicon-germanium (SiGe) layer having a first Ge dopant concentration value, the channel region 2062 may be a second SiGe layer having a second Ge dopant concentration value lower than the first Ge dopant concentration value or may be an intrinsic semiconductor layer.

In an embodiment, the manufactured semiconductor device may be an N-type metal-oxide-semiconductor (NMOS) transistor, wherein the first dopant material may be carbon (C), the stress adjustment element 2061 may be a first silicon carbide (SiC) layer having a first C dopant concentration value, the channel region 2062 may be a second SiC layer having a second C dopant concentration value lower than the first C dopant concentration value or may be an intrinsic semiconductor layer.

The aforementioned dopant concentration relation and/or width configuration relations of the stress adjustment element 2061 and the channel region 2062 inside the trench 205 may enable minimization of impurity scattering and/or impurity diffusion in the channel region 2062. Advantageously, channel mobility and other operation characteristics of the manufactured semiconductor device may be optimized.

Figure 2I:
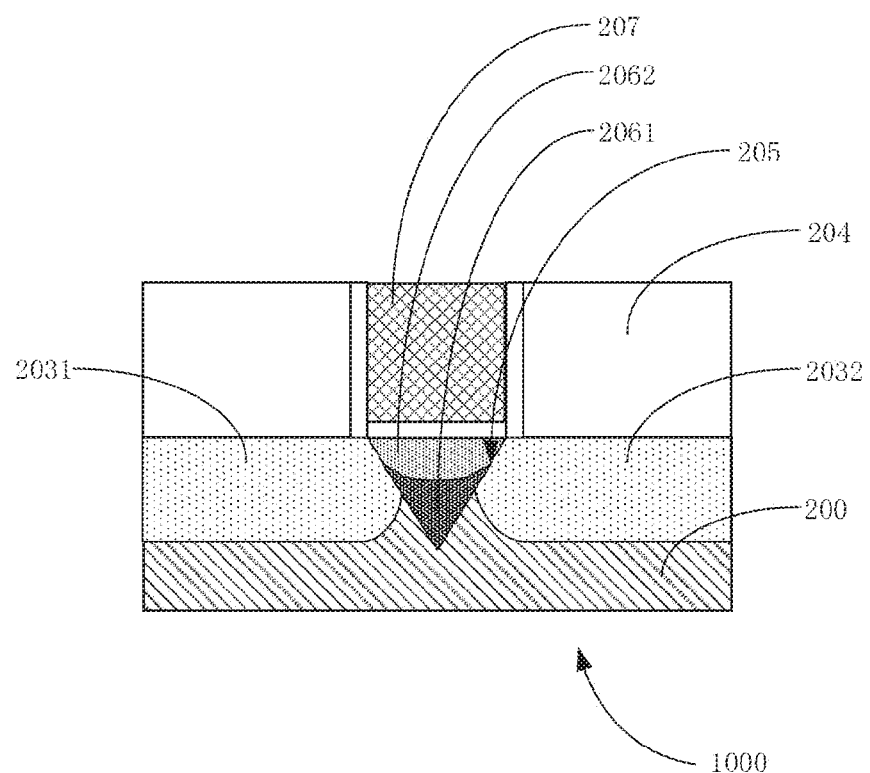

Referring to FIG. 2I, the method may include forming a gate electrode 207 between two portions of the interlayer dielectric layer 204, such that the gate electrode 207 overlaps the channel region 2062. The gate electrode may be formed of a conductive material, such as a polysilicon material and/or a metal material. The method may include forming a gate oxide layer and/or a work function layer before forming the gate electrode 207.

In an embodiment, the process of forming the LDD ion-implanted region and/or the process of forming the PKT ion-implanted region may be performed after at least one of the stress adjustment element 2061 and the channel region 2062 have been formed.

As a result of one or more of the aforementioned process steps and/or one or more other suitable process steps, the semiconductor device 1000 may be manufactured. The semiconductor device 1000 may have one or more advantages discussed above and may have satisfactory quality.

Figure 4:
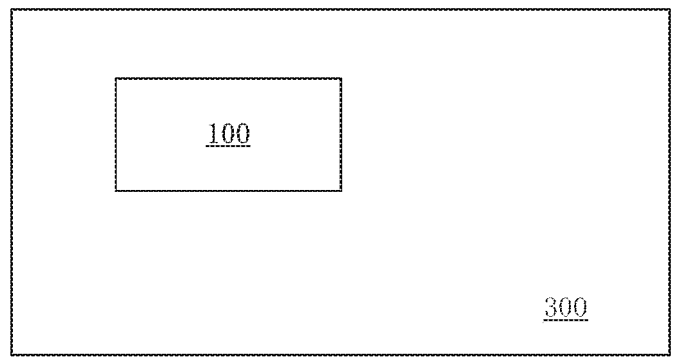
FIG. 4 shows a schematic diagram that illustrates an electronic device in accordance with an embodiment of the present invention.

FIG. 4 shows a schematic diagram that illustrates an electronic device 300 in accordance with an embodiment of the present invention. The electronic device 300 may include a semiconductor device 100. The semiconductor device 100 may include elements (and/or structures) analogous to or identical to elements (and/or structures) of the semiconductor 1000 discussed with reference to FIG. 1 and/or may be manufactured using one or more of the process steps discussed with reference to FIGS. 2A, 2B, 2C, 2D, 2E, 2F, 2G, 2H, 2I, and 3.

In an embodiment, the electronic device 300 may be or may include one or more of a mobile phone, a tablet computer, a notebook computer, a netbook, a game console, a television, a video compact disc (VCD) player, a digital video disc (DVD) player, a navigation device, a camera, a camcorder, a voice recorder, an MP3 player, an MP4 player, and a portable game device.

In an embodiment, the electronic device 300 may be or may include an intermediate product or module that includes the semiconductor device 100.

The semiconductor device 100 may have one or more advantages that are analogous to or identical to one or more of the aforementioned advantages associated with the semiconductor device 1000. Advantageously, the semiconductor device 100 may facilitate optimization of the performance and/or quality of the electronic device 300.

While this invention has been described in terms of several embodiments, there are alterations, permutations, and equivalents, which fall within the scope of this invention. It should also be noted that there are many alternative ways of implementing the methods and apparatuses of the present invention. Furthermore, embodiments of the present invention may find utility in other applications. The abstract section is provided herein for convenience and, due to word count limitation, is accordingly written for reading convenience and should not be employed to limit the scope of the claims. It is therefore intended that the following appended claims be interpreted as including all such alterations, permutations, and equivalents as fall within the true spirit and scope of the present invention.

What is claimed is:

1. A method for manufacturing a semiconductor device, the method comprising:
   preparing a semiconductor substrate;
   forming a trench in the semiconductor substrate;
   forming a source electrode and a drain electrode;
   forming a stress adjustment element inside the trench;
   forming a channel region on the stress adjustment element and inside the trench; and
   forming a gate electrode that overlaps at least one of the semiconductor substrate and the channel region in a direction perpendicular to a surface of the semiconductor substrate,
   wherein a maximum width of the channel region in a direction parallel to the surface of the semiconductor substrate is at a face of the channel region and is greater than a maximum width of the stress adjustment element in the direction parallel to the surface of the semiconductor substrate in a cross-sectional view of the semiconductor device,
   wherein the face of the channel region overlaps the stress adjustment element in the direction perpendicular to the surface of the semiconductor substrate,
   wherein the stress adjustment element is positioned between the face of the channel region and the semiconductor substrate in the direction perpendicular to the surface of the semiconductor substrate,
   wherein a portion of the channel region is positioned between two portions of the stress adjustment element,
   wherein the two portions of the stress adjustment element respectively overlap the source electrode and the drain electrode in the direction perpendicular to the surface of the semiconductor substrate, and
   wherein the channel region directly contacts each of the source electrode, the drain electrode, and the two portions of the stress adjustment element.

2. The method of claim 1, wherein the trench is formed through wet etching, and wherein an etchant that includes one or more of hydrofluoric acid, potassium hydroxide, hydrogen bromide, and acetic acid is used in the wet etching.

3. The method of claim 1, wherein a dopant concentration of a dopant material in the stress adjustment element has a first dopant concentration value, and wherein the channel region is an intrinsic semiconductor element or a dopant concentration of the dopant material in the channel region has a second dopant concentration value that is less than the first dopant concentration value.

4. The method of claim 3, wherein the semiconductor device is a P-type metal-oxide-semiconductor transistor, wherein the dopant material is germanium, wherein the stress adjustment element is a first silicon-germanium element, and wherein the channel region is the intrinsic semiconductor element or a second silicon-germanium layer.

5. The method of claim 3, wherein the semiconductor device is an N-type metal-oxide-semiconductor transistor, wherein the dopant material is carbon, and wherein the channel region is the intrinsic semiconductor element or a silicon carbide element.

6. The method of claim 1, wherein a cross section of the trench has a triangle shape in a cross-sectional view of the semiconductor device, wherein a vertex of the triangle shape is positioned between an edge of the triangle shape and the surface of the semiconductor substrate.

7. The method of claim 1, wherein a depth of a middle portion of the trench in the direction perpendicular to the surface of the semiconductor substrate is in a range of 30 nm to 100 nm.

8. The method of claim 1, wherein the two portions of the stress adjustment element are positioned between the channel region and, respectively, the source electrode and the drain electrode in the direction perpendicular to the surface of the semiconductor substrate.

9. The method of claim 1, wherein a first portion of the semiconductor substrate is positioned between the stress adjustment element and the source electrode in the direction parallel to the surface of the semiconductor substrate, and wherein a second portion of the semiconductor substrate is positioned between the stress adjustment element and the drain electrode in the direction parallel to the surface of the semiconductor substrate.

10. The method of claim 1, wherein the stress adjustment element has a first carbon dopant concentration value, and wherein the channel region has a second carbon dopant concentration value that is lower than the first carbon dopant concentration value.

11. The method of claim 1, wherein the stress adjustment element is a silicon carbide element.

12. The method of claim 1, wherein a doped silicon face of the stress adjustment element directly contacts both a face of the drain electrode and a face of the semiconductor substrate, and wherein the face of the drain electrode directly contacts the channel region.

13. A method for manufacturing a semiconductor device, the method comprising:
   preparing a semiconductor substrate;
   forming a trench in the semiconductor substrate;
   forming a source electrode;
   forming a stress adjustment element inside the trench;
   forming a channel region on the stress adjustment element and inside the trench; and
   forming a gate electrode that overlaps at least one of the semiconductor substrate and the channel region in a direction perpendicular to a surface of the semiconductor substrate;
   wherein a maximum width of the channel region in a direction parallel to the surface of the semiconductor substrate is at a face of the channel region and is greater than a maximum width of the stress adjustment element in the direction parallel to the surface of the semiconductor substrate in a cross-sectional view of the semiconductor device,
   wherein the face of the channel region overlaps the stress adjustment element in the direction perpendicular to the surface of the semiconductor substrate, wherein the stress adjustment element is positioned between the face of the channel region and the semiconductor substrate in the direction perpendicular to the surface of the semiconductor substrate, wherein a face of the source electrode directly contacts the channel region, and wherein an edge of the face of the source electrode directly contacts a doped silicon face of the stress adjustment element and is positioned between two edges of the doped silicon face of the stress adjustment element in the direction parallel to the surface of the semiconductor substrate in the cross-sectional view of the semiconductor device.

\* \* \* \* \*